United States Patent
Assif et al.

(10) Patent No.: US 9,653,861 B2
(45) Date of Patent: May 16, 2017

(54) INTERCONNECTION OF HARDWARE COMPONENTS

(71) Applicant: Corning Optical Communications Wireless Ltd, Airport (IL)

(72) Inventors: Lior Assif, Petah Tikva (IL); Alon Rozenvax, Holon (IL); Roman Vinnik, Yehud (IL)

(73) Assignee: Corning Optical Communications Wireless Ltd, Airport (IL)

( * ) Notice: Subject to any disclaimer, the term of this patent is extended or adjusted under 35 U.S.C. 154(b) by 0 days.

(21) Appl. No.: 14/853,118

(22) Filed: Sep. 14, 2015

(65) Prior Publication Data

US 2017/0077661 A1    Mar. 16, 2017

Related U.S. Application Data

(60) Provisional application No. 62/051,510, filed on Sep. 17, 2014.

(51) Int. Cl.
| | |
|---|---|
| *H01R 13/627* | (2006.01) |
| *H01R 25/00* | (2006.01) |
| *H01R 43/26* | (2006.01) |
| *H01R 24/52* | (2011.01) |

(52) U.S. Cl.
CPC ........... *H01R 25/006* (2013.01); *H01R 24/52* (2013.01); *H01R 43/26* (2013.01)

(58) Field of Classification Search
CPC ...... H01R 25/006; H01R 24/52; H01R 43/26; H05K 7/1452; G02B 6/3821; G02B 6/3849; G02B 6/3897; G02B 6/4292; G02B 6/4249; G02B 6/3885; G02B 6/3869; H04B 10/2575

USPC ........................................................ 439/359
See application file for complete search history.

(56) References Cited

U.S. PATENT DOCUMENTS

| | | | |
|---|---|---|---|
| 264,299 | A | 9/1882 | Johnson |
| 454,430 | A | 6/1891 | Greenfield |
| 4,449,246 | A | 5/1984 | Seiler et al. |
| 4,665,560 | A | 5/1987 | Lange |
| 4,939,852 | A | 7/1990 | Brenner |
| 4,972,346 | A | 11/1990 | Kawano et al. |
| 5,056,109 | A | 10/1991 | Gilhousen et al. |

(Continued)

FOREIGN PATENT DOCUMENTS

| | | |
|---|---|---|
| CN | 101030162 A | 9/2007 |
| CN | 101232179 A | 7/2008 |

(Continued)

OTHER PUBLICATIONS

International Search Report for PCT/US2010/056458 mailed Aug. 2, 2011, 4 pages.

(Continued)

*Primary Examiner* — Jean F Duverne
(74) *Attorney, Agent, or Firm* — C. Keith Montgomery

(57) ABSTRACT

A method and related apparatuses for disconnecting components of a hardware assembly. The components each include two connectors configured to disengage in a staged manner so that one set of connectors disconnects before the other set. If power connectivity is provided across one set of connectors, that connection can be configured to end before the connectivity between the other connectors.

6 Claims, 3 Drawing Sheets

(56) References Cited

U.S. PATENT DOCUMENTS

| | | | |
|---|---|---|---|
| 5,138,679 A * | 8/1992 | Edwards | G02B 6/3869 250/227.11 |
| 5,187,803 A | 2/1993 | Sohner et al. | |
| 5,206,655 A | 4/1993 | Caille et al. | |
| 5,208,812 A | 5/1993 | Dudek et al. | |
| 5,278,989 A | 1/1994 | Burke et al. | |
| 5,280,472 A | 1/1994 | Gilhousen et al. | |
| 5,329,604 A * | 7/1994 | Baldwin | G02B 6/3849 385/92 |
| 5,381,459 A | 1/1995 | Lappington | |
| 5,396,224 A | 3/1995 | Dukes et al. | |
| 5,420,863 A | 5/1995 | Taketsugu et al. | |
| 5,432,838 A | 7/1995 | Purchase et al. | |
| 5,436,827 A | 7/1995 | Gunn et al. | |
| 5,519,830 A | 5/1996 | Opoczynski | |
| 5,534,854 A | 7/1996 | Bradbury et al. | |
| 5,559,831 A | 9/1996 | Keith | |
| 5,598,314 A | 1/1997 | Hall | |
| 5,606,725 A | 2/1997 | Hart | |
| 5,668,562 A | 9/1997 | Cutrer et al. | |
| 5,682,256 A | 10/1997 | Motley et al. | |
| 5,708,681 A | 1/1998 | Malkemes et al. | |
| 5,726,984 A | 3/1998 | Kubler et al. | |
| 5,765,099 A | 6/1998 | Georges et al. | |
| 5,790,536 A | 8/1998 | Mahany et al. | |
| 5,802,173 A | 9/1998 | Hamilton-Piercy et al. | |
| 5,809,395 A | 9/1998 | Hamilton-Piercy et al. | |
| 5,809,431 A | 9/1998 | Bustamante et al. | |
| 5,818,883 A | 10/1998 | Smith et al. | |
| 5,839,052 A | 11/1998 | Dean et al. | |
| 5,862,460 A | 1/1999 | Rich | |
| 5,867,763 A | 2/1999 | Dean et al. | |
| 5,889,469 A | 3/1999 | Mykytiuk et al. | |
| 5,953,670 A | 9/1999 | Newson | |
| 5,969,837 A | 10/1999 | Farber et al. | |
| 5,983,070 A | 11/1999 | Georges et al. | |
| 6,006,069 A | 12/1999 | Langston | |
| 6,011,980 A | 1/2000 | Nagano et al. | |
| 6,014,546 A | 1/2000 | Georges et al. | |
| 6,037,898 A | 3/2000 | Parish et al. | |
| 6,060,879 A | 5/2000 | Mussenden | |
| 6,069,721 A | 5/2000 | Oh et al. | |
| 6,118,767 A | 9/2000 | Shen et al. | |
| 6,122,529 A | 9/2000 | Sabat, Jr. et al. | |
| 6,125,048 A | 9/2000 | Loughran et al. | |
| 6,128,477 A | 10/2000 | Freed | |
| 6,146,187 A | 11/2000 | Pallai | |
| 6,157,810 A | 12/2000 | Georges et al. | |
| 6,163,266 A | 12/2000 | Fasullo et al. | |
| 6,188,876 B1 | 2/2001 | Kim | |
| 6,192,216 B1 | 2/2001 | Sabat, Jr. et al. | |
| 6,194,968 B1 | 2/2001 | Winslow | |
| 6,212,397 B1 | 4/2001 | Langston et al. | |
| 6,222,503 B1 | 4/2001 | Gietema | |
| 6,223,201 B1 | 4/2001 | Reznak | |
| 6,236,863 B1 | 5/2001 | Waldroup et al. | |
| 6,275,990 B1 | 8/2001 | Dapper et al. | |
| 6,279,158 B1 | 8/2001 | Geile et al. | |
| 6,295,451 B1 | 9/2001 | Mimura | |
| 6,307,869 B1 | 10/2001 | Pawelski | |
| 6,317,599 B1 | 11/2001 | Rappaport et al. | |
| 6,330,241 B1 | 12/2001 | Fort | |
| 6,330,244 B1 | 12/2001 | Swartz et al. | |
| 6,334,219 B1 | 12/2001 | Hill et al. | |
| 6,336,021 B1 | 1/2002 | Nukada | |
| 6,336,042 B1 | 1/2002 | Dawson et al. | |
| 6,340,932 B1 | 1/2002 | Rodgers et al. | |
| 6,353,600 B1 | 3/2002 | Schwartz et al. | |
| 6,366,774 B1 | 4/2002 | Ketonen et al. | |
| 6,370,203 B1 | 4/2002 | Boesch et al. | |
| 6,374,124 B1 | 4/2002 | Slabinski | |
| 6,389,010 B1 | 5/2002 | Kubler et al. | |
| 6,400,318 B1 | 6/2002 | Kasami et al. | |
| 6,400,418 B1 | 6/2002 | Wakabayashi | |
| 6,405,018 B1 | 6/2002 | Reudink et al. | |
| 6,415,132 B1 | 7/2002 | Sabat, Jr. | |
| 6,421,327 B1 | 7/2002 | Lundby | |
| 6,448,558 B1 | 9/2002 | Greene | |
| 6,452,915 B1 | 9/2002 | Jorgensen | |
| 6,480,702 B1 | 11/2002 | Sabat, Jr. | |
| 6,496,290 B1 | 12/2002 | Lee | |
| 6,519,449 B1 | 2/2003 | Zhang et al. | |
| 6,535,330 B1 | 3/2003 | Lelic et al. | |
| 6,535,720 B1 | 3/2003 | Kintis et al. | |
| 6,551,065 B2 | 4/2003 | Lee | |
| 6,580,402 B2 | 6/2003 | Navarro et al. | |
| 6,580,905 B1 | 6/2003 | Naidu et al. | |
| 6,587,514 B1 | 7/2003 | Wright et al. | |
| 6,588,943 B1 * | 7/2003 | Howard | G02B 6/4292 385/14 |
| 6,598,009 B2 | 7/2003 | Yang | |
| 6,615,074 B2 | 9/2003 | Mickle et al. | |
| 6,628,732 B1 | 9/2003 | Takaki | |
| 6,657,535 B1 | 12/2003 | Magbie et al. | |
| 6,658,269 B1 | 12/2003 | Golemon et al. | |
| 6,665,308 B1 | 12/2003 | Rakib et al. | |
| 6,670,930 B2 | 12/2003 | Navarro | |
| 6,678,509 B2 | 1/2004 | Skarman et al. | |
| 6,704,298 B1 | 3/2004 | Matsumiya et al. | |
| 6,745,013 B1 | 6/2004 | Porter et al. | |
| 6,763,226 B1 | 7/2004 | McZeal, Jr. | |
| 6,785,558 B1 | 8/2004 | Stratford et al. | |
| 6,801,767 B1 | 10/2004 | Schwartz et al. | |
| 6,823,174 B1 | 11/2004 | Masenten et al. | |
| 6,826,163 B2 | 11/2004 | Mani et al. | |
| 6,836,660 B1 | 12/2004 | Wala | |
| 6,836,673 B1 | 12/2004 | Trott | |
| 6,842,433 B2 | 1/2005 | West et al. | |
| 6,850,510 B2 | 2/2005 | Kubler | |
| 6,876,056 B2 | 4/2005 | Tilmans et al. | |
| 6,882,311 B2 | 4/2005 | Walker et al. | |
| 6,885,344 B2 | 4/2005 | Mohamadi | |
| 6,919,858 B2 | 7/2005 | Rofougaran | |
| 6,931,659 B1 | 8/2005 | Kinemura | |
| 6,934,511 B1 | 8/2005 | Lovinggood et al. | |
| 6,934,541 B2 | 8/2005 | Miyatani | |
| 6,941,112 B2 | 9/2005 | Hasegawa | |
| 6,961,312 B2 | 11/2005 | Kubler et al. | |
| 6,977,502 B1 | 12/2005 | Hertz | |
| 6,984,073 B2 * | 1/2006 | Cox | G02B 6/3897 385/55 |
| 7,011,551 B2 | 3/2006 | Johansen et al. | |
| 7,015,826 B1 | 3/2006 | Chan et al. | |
| 7,020,488 B1 | 3/2006 | Bleile et al. | |
| 7,024,166 B2 | 4/2006 | Wallace et al. | |
| 7,039,399 B2 | 5/2006 | Fischer | |
| 7,043,271 B1 | 5/2006 | Seto et al. | |
| 7,050,017 B2 | 5/2006 | King et al. | |
| 7,052,335 B2 | 5/2006 | Matsuura et al. | |
| 7,053,838 B2 | 5/2006 | Judd | |
| 7,069,577 B2 | 6/2006 | Geile et al. | |
| 7,072,586 B2 | 7/2006 | Aburakawa et al. | |
| 7,073,953 B2 * | 7/2006 | Roth | G02B 6/3821 385/53 |
| 7,103,119 B2 | 9/2006 | Matsuoka et al. | |
| 7,103,377 B2 | 9/2006 | Bauman et al. | |
| 7,110,795 B2 | 9/2006 | Doi | |
| 7,142,125 B2 | 11/2006 | Larson et al. | |
| 7,142,535 B2 | 11/2006 | Kubler et al. | |
| 7,142,619 B2 | 11/2006 | Sommer et al. | |
| 7,144,255 B2 | 12/2006 | Seymour | |
| 7,171,244 B2 | 1/2007 | Bauman | |
| 7,177,728 B2 | 2/2007 | Gardner | |
| 7,184,728 B2 | 2/2007 | Solum | |
| 7,190,748 B2 | 3/2007 | Kim et al. | |
| 7,194,023 B2 | 3/2007 | Norrell et al. | |
| 7,199,443 B2 | 4/2007 | Elsharawy | |
| 7,269,311 B2 | 9/2007 | Kim et al. | |
| 7,315,735 B2 | 1/2008 | Graham | |
| 7,359,647 B1 | 4/2008 | Faria et al. | |
| 7,359,674 B2 | 4/2008 | Markki et al. | |
| 7,366,151 B2 | 4/2008 | Kubler et al. | |
| 7,369,526 B2 | 5/2008 | Lechleider et al. | |
| 7,388,892 B2 | 6/2008 | Nishiyama et al. | |

(56) References Cited

U.S. PATENT DOCUMENTS

| | | |
|---|---|---|
| 7,392,025 B2 | 6/2008 | Rooyen et al. |
| 7,412,224 B2 | 8/2008 | Kotola et al. |
| 7,450,853 B2 | 11/2008 | Kim et al. |
| 7,451,365 B2 | 11/2008 | Wang et al. |
| 7,454,171 B2 | 11/2008 | Palin et al. |
| 7,460,507 B2 | 12/2008 | Kubler et al. |
| 7,469,105 B2 | 12/2008 | Wake et al. |
| 7,483,711 B2 | 1/2009 | Burchfiel |
| 7,486,782 B1 | 2/2009 | Roos |
| 7,505,747 B2 | 3/2009 | Solum |
| 7,512,419 B2 | 3/2009 | Solum |
| 7,515,526 B2 | 4/2009 | Elkayam et al. |
| 7,526,303 B2 | 4/2009 | Chary |
| 7,539,509 B2 | 5/2009 | Bauman et al. |
| 7,542,452 B2 | 6/2009 | Penumetsa |
| 7,546,138 B2 | 6/2009 | Bauman |
| 7,548,138 B2 | 6/2009 | Kamgaing |
| 7,551,641 B2 | 6/2009 | Pirzada et al. |
| 7,557,758 B2 | 7/2009 | Rofougaran |
| 7,567,579 B2 | 7/2009 | Korcharz et al. |
| 7,580,384 B2 | 8/2009 | Kubler et al. |
| 7,585,119 B2 * | 9/2009 | Sasaki .................. G02B 6/3885 385/53 |
| 7,586,861 B2 | 9/2009 | Kubler et al. |
| 7,587,559 B2 | 9/2009 | Brittain et al. |
| 7,599,420 B2 | 10/2009 | Forenza et al. |
| 7,610,046 B2 | 10/2009 | Wala |
| 7,619,535 B2 | 11/2009 | Chen et al. |
| 7,630,690 B2 | 12/2009 | Kaewell, Jr. et al. |
| 7,633,934 B2 | 12/2009 | Kubler et al. |
| 7,639,982 B2 | 12/2009 | Wala |
| 7,646,743 B2 | 1/2010 | Kubler et al. |
| 7,646,777 B2 | 1/2010 | Hicks, III et al. |
| 7,653,397 B2 | 1/2010 | Pernu et al. |
| 7,668,565 B2 | 2/2010 | Ylänen et al. |
| 7,688,811 B2 | 3/2010 | Kubler et al. |
| 7,693,486 B2 | 4/2010 | Kasslin et al. |
| 7,697,467 B2 | 4/2010 | Kubler et al. |
| 7,715,375 B2 | 5/2010 | Kubler et al. |
| 7,751,374 B2 | 7/2010 | Donovan |
| 7,751,838 B2 | 7/2010 | Ramesh et al. |
| 7,760,703 B2 | 7/2010 | Kubler et al. |
| 7,768,951 B2 | 8/2010 | Kubler et al. |
| 7,773,573 B2 | 8/2010 | Chung et al. |
| 7,778,603 B2 | 8/2010 | Palin et al. |
| 7,809,012 B2 | 10/2010 | Ruuska et al. |
| 7,812,766 B2 | 10/2010 | Leblanc et al. |
| 7,817,969 B2 | 10/2010 | Castaneda et al. |
| 7,835,328 B2 | 11/2010 | Stephens et al. |
| 7,848,316 B2 | 12/2010 | Kubler et al. |
| 7,848,770 B2 | 12/2010 | Scheinert |
| 7,852,228 B2 | 12/2010 | Teng et al. |
| 7,853,234 B2 | 12/2010 | Afsahi |
| 7,870,321 B2 | 1/2011 | Rofougaran |
| 7,881,755 B1 | 2/2011 | Mishra et al. |
| 7,894,423 B2 | 2/2011 | Kubler et al. |
| 7,899,007 B2 | 3/2011 | Kubler et al. |
| 7,907,972 B2 | 3/2011 | Walton et al. |
| 7,912,043 B2 | 3/2011 | Kubler et al. |
| 7,916,706 B2 | 3/2011 | Kubler et al. |
| 7,917,177 B2 | 3/2011 | Bauman |
| 7,920,553 B2 | 4/2011 | Kubler et al. |
| 7,920,858 B2 | 4/2011 | Sabat, Jr. et al. |
| 7,924,783 B1 | 4/2011 | Mahany et al. |
| 7,936,713 B2 | 5/2011 | Kubler et al. |
| 7,949,364 B2 | 5/2011 | Kasslin et al. |
| 7,957,777 B1 | 6/2011 | Vu et al. |
| 7,962,111 B2 | 6/2011 | Solum |
| 7,969,009 B2 | 6/2011 | Chandrasekaran |
| 7,969,911 B2 | 6/2011 | Mahany et al. |
| 7,970,428 B2 | 6/2011 | Lin et al. |
| 7,980,902 B2 | 7/2011 | Capaldi-Tallon |
| 7,990,925 B2 | 8/2011 | Tinnakornsrisuphap et al. |
| 7,996,020 B1 | 8/2011 | Chhabra |
| 8,001,397 B2 | 8/2011 | Hansalia |
| 8,018,907 B2 | 9/2011 | Kubler et al. |
| 8,036,157 B2 | 10/2011 | Hanabusa et al. |
| 8,036,308 B2 | 10/2011 | Rofougaran |
| 8,082,353 B2 | 12/2011 | Huber et al. |
| 8,086,192 B2 | 12/2011 | Rofougaran et al. |
| 8,113,858 B1 | 2/2012 | Chiang |
| 8,155,525 B2 | 4/2012 | Cox |
| 8,270,838 B2 | 9/2012 | Cox |
| 8,270,990 B2 | 9/2012 | Zhao |
| 8,306,563 B2 | 11/2012 | Zavadsky et al. |
| 8,328,145 B2 | 12/2012 | Smith |
| 8,406,941 B2 | 3/2013 | Smith |
| 8,417,979 B2 | 4/2013 | Maroney |
| 8,457,562 B2 | 6/2013 | Zavadsky et al. |
| 8,514,092 B2 | 8/2013 | Cao et al. |
| 8,532,492 B2 | 9/2013 | Palanisamy et al. |
| 8,548,330 B2 | 10/2013 | Berlin et al. |
| 8,588,614 B2 | 11/2013 | Larsen |
| 8,620,375 B2 | 12/2013 | Kim et al. |
| 8,622,632 B2 * | 1/2014 | Isenhour .............. G02B 6/4249 385/78 |
| 8,649,684 B2 | 2/2014 | Casterline et al. |
| 8,744,390 B2 | 6/2014 | Stratford |
| 8,830,035 B2 | 9/2014 | Lindley et al. |
| 8,831,428 B2 | 9/2014 | Kobyakov et al. |
| 8,831,593 B2 | 9/2014 | Melester et al. |
| 8,855,832 B2 | 10/2014 | Rees |
| 8,930,736 B2 | 1/2015 | James |
| 8,971,903 B2 | 3/2015 | Hossain et al. |
| 8,994,276 B2 | 3/2015 | Recker et al. |
| 9,026,036 B2 | 5/2015 | Saban et al. |
| 9,160,449 B2 | 10/2015 | Heidler et al. |
| 9,166,690 B2 * | 10/2015 | Brower .............. H04B 10/2575 |
| 9,223,336 B2 * | 12/2015 | Petersen .................. G06F 1/00 |
| 9,343,797 B2 * | 5/2016 | Shoemaker ........... H01Q 1/007 |
| 2001/0036199 A1 | 11/2001 | Terry |
| 2002/0051434 A1 | 5/2002 | Ozluturk et al. |
| 2002/0097031 A1 | 7/2002 | Cook et al. |
| 2002/0123365 A1 | 9/2002 | Thorson et al. |
| 2002/0180554 A1 * | 12/2002 | Clark .................. H05K 7/1452 333/33 |
| 2003/0111909 A1 | 6/2003 | Liu et al. |
| 2003/0146765 A1 | 8/2003 | Darshan et al. |
| 2003/0147353 A1 | 8/2003 | Clarkson et al. |
| 2004/0095907 A1 | 5/2004 | Agee et al. |
| 2004/0146020 A1 | 7/2004 | Kubler et al. |
| 2004/0151164 A1 | 8/2004 | Kubler et al. |
| 2004/0160912 A1 | 8/2004 | Kubler et al. |
| 2004/0160913 A1 | 8/2004 | Kubler et al. |
| 2004/0165573 A1 | 8/2004 | Kubler et al. |
| 2004/0203704 A1 | 10/2004 | Ommodt et al. |
| 2004/0230846 A1 | 11/2004 | Mancey et al. |
| 2005/0047030 A1 | 3/2005 | Lee |
| 2005/0147071 A1 | 7/2005 | Karaoguz et al. |
| 2005/0159051 A1 | 7/2005 | Matsuura et al. |
| 2005/0226625 A1 | 10/2005 | Wake et al. |
| 2005/0272439 A1 | 12/2005 | Picciriello et al. |
| 2006/0053324 A1 | 3/2006 | Giat et al. |
| 2006/0084379 A1 | 4/2006 | O'Neill |
| 2006/0192434 A1 | 8/2006 | Vrla et al. |
| 2006/0199444 A1 | 9/2006 | Germani |
| 2006/0228952 A1 | 10/2006 | Feldman et al. |
| 2006/0274704 A1 | 12/2006 | Desai et al. |
| 2007/0004467 A1 | 1/2007 | Chary |
| 2007/0058332 A1 | 3/2007 | Canterbury et al. |
| 2007/0060045 A1 | 3/2007 | Prautzsch |
| 2007/0060055 A1 | 3/2007 | Desai et al. |
| 2007/0076649 A1 | 4/2007 | Lin et al. |
| 2007/0224954 A1 | 9/2007 | Gopi |
| 2007/0286599 A1 | 12/2007 | Sauer et al. |
| 2007/0291732 A1 | 12/2007 | Todd et al. |
| 2007/0297005 A1 | 12/2007 | Montierth et al. |
| 2008/0002614 A1 | 1/2008 | Hanabusa et al. |
| 2008/0032566 A1 | 2/2008 | Walter et al. |
| 2008/0043714 A1 | 2/2008 | Pernu |
| 2008/0044186 A1 | 2/2008 | George et al. |
| 2008/0045271 A1 | 2/2008 | Azuma |
| 2008/0070502 A1 | 3/2008 | George et al. |
| 2008/0080863 A1 | 4/2008 | Sauer et al. |

(56) References Cited

U.S. PATENT DOCUMENTS

| | | |
|---|---|---|
| 2008/0098203 A1 | 4/2008 | Master et al. |
| 2008/0118014 A1 | 5/2008 | Reunamaki et al. |
| 2008/0129634 A1 | 6/2008 | Pera et al. |
| 2008/0134194 A1 | 6/2008 | Liu |
| 2008/0164890 A1 | 7/2008 | Admon et al. |
| 2008/0166094 A1 | 7/2008 | Bookbinder et al. |
| 2008/0167931 A1 | 7/2008 | Gerstemeier et al. |
| 2008/0186143 A1 | 8/2008 | George et al. |
| 2008/0207253 A1 | 8/2008 | Jaakkola et al. |
| 2008/0251071 A1 | 10/2008 | Armitstead et al. |
| 2008/0252307 A1 | 10/2008 | Schindler |
| 2008/0253351 A1 | 10/2008 | Pernu et al. |
| 2008/0261656 A1 | 10/2008 | Bella et al. |
| 2008/0268833 A1 | 10/2008 | Huang et al. |
| 2008/0272725 A1 | 11/2008 | Bojrup et al. |
| 2008/0279137 A1 | 11/2008 | Pernu et al. |
| 2008/0280569 A1 | 11/2008 | Hazani et al. |
| 2008/0291830 A1 | 11/2008 | Pernu et al. |
| 2008/0292322 A1 | 11/2008 | Daghighian et al. |
| 2009/0007192 A1 | 1/2009 | Singh |
| 2009/0022304 A1 | 1/2009 | Kubler et al. |
| 2009/0028087 A1 | 1/2009 | Nguyen et al. |
| 2009/0028317 A1 | 1/2009 | Ling et al. |
| 2009/0040027 A1 | 2/2009 | Nakao |
| 2009/0055672 A1 | 2/2009 | Burkland et al. |
| 2009/0059903 A1 | 3/2009 | Kubler et al. |
| 2009/0061796 A1 | 3/2009 | Arkko et al. |
| 2009/0073916 A1 | 3/2009 | Zhang et al. |
| 2009/0100275 A1 | 4/2009 | Chang et al. |
| 2009/0121548 A1 | 5/2009 | Schindler et al. |
| 2009/0149221 A1 | 6/2009 | Liu et al. |
| 2009/0169163 A1 | 7/2009 | Abbott, III et al. |
| 2009/0175214 A1 | 7/2009 | Sfar et al. |
| 2009/0218407 A1 | 9/2009 | Rofougaran |
| 2009/0218657 A1 | 9/2009 | Rofougaran |
| 2009/0245084 A1 | 10/2009 | Moffatt et al. |
| 2009/0245153 A1 | 10/2009 | Li et al. |
| 2009/0245221 A1 | 10/2009 | Piipponen |
| 2009/0252136 A1 | 10/2009 | Mahany et al. |
| 2009/0252205 A1 | 10/2009 | Rheinfelder et al. |
| 2009/0258652 A1 | 10/2009 | Lambert et al. |
| 2009/0280854 A1 | 11/2009 | Khan et al. |
| 2009/0285147 A1 | 11/2009 | Subasic et al. |
| 2010/0002626 A1 | 1/2010 | Schmidt et al. |
| 2010/0027443 A1 | 2/2010 | LoGalbo et al. |
| 2010/0054746 A1 | 3/2010 | Logan |
| 2010/0056184 A1 | 3/2010 | Vakil et al. |
| 2010/0056200 A1 | 3/2010 | Tolonen |
| 2010/0080154 A1 | 4/2010 | Noh et al. |
| 2010/0080182 A1 | 4/2010 | Kubler et al. |
| 2010/0091475 A1 | 4/2010 | Toms et al. |
| 2010/0118864 A1 | 5/2010 | Kubler et al. |
| 2010/0127937 A1 | 5/2010 | Chandrasekaran et al. |
| 2010/0134257 A1 | 6/2010 | Puleston et al. |
| 2010/0148373 A1 | 6/2010 | Chandrasekaran |
| 2010/0156721 A1 | 6/2010 | Alamouti et al. |
| 2010/0188998 A1 | 7/2010 | Pernu et al. |
| 2010/0190509 A1 | 7/2010 | Davis |
| 2010/0202326 A1 | 8/2010 | Rofougaran et al. |
| 2010/0225413 A1 | 9/2010 | Rofougaran et al. |
| 2010/0225556 A1 | 9/2010 | Rofougaran et al. |
| 2010/0225557 A1 | 9/2010 | Rofougaran et al. |
| 2010/0232323 A1 | 9/2010 | Kubler et al. |
| 2010/0246558 A1 | 9/2010 | Harel |
| 2010/0255774 A1 | 10/2010 | Kenington |
| 2010/0258949 A1 | 10/2010 | Henderson et al. |
| 2010/0260063 A1 | 10/2010 | Kubler et al. |
| 2010/0290355 A1 | 11/2010 | Roy et al. |
| 2010/0290787 A1 | 11/2010 | Cox |
| 2010/0309049 A1 | 12/2010 | Reunamäki et al. |
| 2010/0311472 A1 | 12/2010 | Rofougaran et al. |
| 2010/0311480 A1 | 12/2010 | Raines et al. |
| 2010/0322206 A1 | 12/2010 | Hole et al. |
| 2010/0329161 A1 | 12/2010 | Ylanen et al. |
| 2010/0329166 A1 | 12/2010 | Mahany et al. |
| 2011/0007724 A1 | 1/2011 | Mahany et al. |
| 2011/0007733 A1 | 1/2011 | Kubler et al. |
| 2011/0021146 A1 | 1/2011 | Pernu |
| 2011/0021224 A1 | 1/2011 | Koskinen et al. |
| 2011/0055861 A1 | 3/2011 | Covell et al. |
| 2011/0065450 A1 | 3/2011 | Kazmi |
| 2011/0069668 A1 | 3/2011 | Chion et al. |
| 2011/0071734 A1 | 3/2011 | Van Wiemeersch et al. |
| 2011/0086614 A1 | 4/2011 | Brisebois et al. |
| 2011/0105110 A1 | 5/2011 | Carmon et al. |
| 2011/0116572 A1 | 5/2011 | Lee et al. |
| 2011/0126071 A1 | 5/2011 | Han et al. |
| 2011/0149879 A1 | 6/2011 | Noriega et al. |
| 2011/0158298 A1 | 6/2011 | Djadi et al. |
| 2011/0172841 A1 | 7/2011 | Forbes, Jr. |
| 2011/0182230 A1 | 7/2011 | Ohm et al. |
| 2011/0194475 A1 | 8/2011 | Kim et al. |
| 2011/0201368 A1 | 8/2011 | Faccin et al. |
| 2011/0204504 A1 | 8/2011 | Henderson et al. |
| 2011/0211439 A1 | 9/2011 | Manpuria et al. |
| 2011/0215901 A1 | 9/2011 | Van Wiemeersch et al. |
| 2011/0222415 A1 | 9/2011 | Ramamurthi et al. |
| 2011/0222434 A1 | 9/2011 | Chen |
| 2011/0222619 A1 | 9/2011 | Ramamurthi et al. |
| 2011/0223795 A1 | 9/2011 | Schafmeister |
| 2011/0227795 A1 | 9/2011 | Lopez et al. |
| 2011/0244887 A1 | 10/2011 | Dupray et al. |
| 2011/0249715 A1 | 10/2011 | Choi et al. |
| 2011/0256878 A1 | 10/2011 | Zhu et al. |
| 2011/0260939 A1 | 10/2011 | Korva et al. |
| 2011/0266999 A1 | 11/2011 | Yodfat et al. |
| 2011/0268033 A1 | 11/2011 | Boldi et al. |
| 2011/0268446 A1 | 11/2011 | Cune et al. |
| 2011/0268449 A1 | 11/2011 | Berlin et al. |
| 2011/0268452 A1 | 11/2011 | Beamon et al. |
| 2011/0274021 A1 | 11/2011 | He et al. |
| 2011/0281536 A1 | 11/2011 | Lee et al. |
| 2012/0009926 A1 | 1/2012 | Hevizi et al. |
| 2012/0033676 A1 | 2/2012 | Mundra et al. |
| 2012/0099448 A1 | 4/2012 | Matsuo et al. |
| 2012/0106442 A1 | 5/2012 | Xiao |
| 2012/0120995 A1 | 5/2012 | Wurth |
| 2012/0122405 A1 | 5/2012 | Gerber et al. |
| 2012/0163829 A1 | 6/2012 | Cox |
| 2012/0196611 A1 | 8/2012 | Venkatraman et al. |
| 2012/0214538 A1 | 8/2012 | Kim et al. |
| 2012/0289224 A1 | 11/2012 | Hallberg et al. |
| 2012/0293390 A1 | 11/2012 | Shoemaker et al. |
| 2012/0307876 A1 | 12/2012 | Trachewsky et al. |
| 2012/0317426 A1 | 12/2012 | Hunter, Jr. et al. |
| 2012/0319916 A1 | 12/2012 | Gears et al. |
| 2013/0017863 A1 | 1/2013 | Kummetz et al. |
| 2013/0035047 A1 | 2/2013 | Chen et al. |
| 2013/0040676 A1 | 2/2013 | Kang et al. |
| 2013/0049469 A1 | 2/2013 | Huff et al. |
| 2013/0094425 A1 | 4/2013 | Soriaga et al. |
| 2013/0102309 A1 | 4/2013 | Chande et al. |
| 2013/0132683 A1 | 5/2013 | Ajanovic et al. |
| 2013/0188959 A1 | 7/2013 | Cune et al. |
| 2013/0225182 A1 | 8/2013 | Singh et al. |
| 2013/0225183 A1 | 8/2013 | Meshkati et al. |
| 2013/0235726 A1 | 9/2013 | Frederiksen et al. |
| 2013/0249292 A1 | 9/2013 | Blackwell, Jr. et al. |
| 2013/0260706 A1 | 10/2013 | Singh |
| 2013/0295980 A1 | 11/2013 | Reuven et al. |
| 2013/0330086 A1 | 12/2013 | Berlin et al. |
| 2013/0337750 A1 | 12/2013 | Ko |
| 2014/0024402 A1 | 1/2014 | Singh |
| 2014/0037294 A1 | 2/2014 | Cox et al. |
| 2014/0050482 A1 | 2/2014 | Berlin et al. |
| 2014/0075217 A1 | 3/2014 | Wong et al. |
| 2014/0087742 A1 | 3/2014 | Brower et al. |
| 2014/0089688 A1 | 3/2014 | Man et al. |
| 2014/0097846 A1 | 4/2014 | Lemaire et al. |
| 2014/0146692 A1 | 5/2014 | Hazani et al. |
| 2014/0148214 A1 | 5/2014 | Sasson |
| 2014/0153919 A1 | 6/2014 | Casterline et al. |
| 2014/0169246 A1 | 6/2014 | Chui et al. |
| 2014/0233442 A1 | 8/2014 | Atias et al. |

(56) References Cited

U.S. PATENT DOCUMENTS

| | | |
|---|---|---|
| 2014/0293894 A1 | 10/2014 | Saban et al. |
| 2014/0308043 A1 | 10/2014 | Heidler et al. |
| 2014/0308044 A1 | 10/2014 | Heidler et al. |
| 2015/0098350 A1 | 4/2015 | Mini et al. |
| 2015/0118889 A1 | 4/2015 | Assif et al. |
| 2015/0249513 A1 | 9/2015 | Schwab et al. |
| 2015/0380928 A1 | 12/2015 | Saig et al. |
| 2016/0173291 A1 | 6/2016 | Hazani et al. |

FOREIGN PATENT DOCUMENTS

| | | |
|---|---|---|
| CN | 101803246 A | 8/2010 |
| CN | 101876962 A | 11/2010 |
| DE | 10114921 A1 | 10/2002 |
| EP | 0851618 A2 | 7/1998 |
| EP | 0924881 A2 | 6/1999 |
| EP | 1227605 A2 | 7/2002 |
| EP | 1347584 A2 | 9/2003 |
| EP | 1954019 A1 | 8/2008 |
| EP | 2037536 B1 | 7/2012 |
| GB | 747630 A | 4/1956 |
| GB | 2275834 A | 9/1994 |
| JP | 58055770 A | 4/1983 |
| JP | H0337819 B2 | 6/1991 |
| JP | 2000268898 A | 9/2000 |
| JP | 2002353813 A | 12/2002 |
| KR | 20040053467 A | 6/2004 |
| KR | 10887791 B1 | 3/2009 |
| KR | 1031619 B1 | 4/2011 |
| WO | 9603823 A1 | 2/1996 |
| WO | 0072475 A1 | 11/2000 |
| WO | 0184760 A1 | 11/2001 |
| WO | 03024027 A1 | 3/2003 |
| WO | 2005117337 A1 | 12/2005 |
| WO | 2006077569 A1 | 7/2006 |
| WO | 2006077570 A1 | 7/2006 |
| WO | 2008083317 A1 | 7/2008 |
| WO | 2009014710 A1 | 1/2009 |
| WO | 2009145789 A1 | 12/2009 |
| WO | 2010090999 A1 | 8/2010 |
| WO | 2010132292 A1 | 11/2010 |
| WO | 2011123314 A1 | 10/2011 |
| WO | 2012051227 A1 | 4/2012 |
| WO | 2012051230 A1 | 4/2012 |
| WO | 2012064333 A1 | 5/2012 |
| WO | 2012071367 A1 | 5/2012 |
| WO | 2012103822 A2 | 8/2012 |
| WO | 2015049671 A2 | 4/2015 |

OTHER PUBLICATIONS

International Preliminary Report on Patentability for PCT/US2010/056458 mailed May 23, 2013, 9 pages.
Non-final Office Action for U.S. Appl. No. 13/410,916 mailed Jul. 18, 2012, 13 pages.
Notice of Allowance for U.S. Appl. No. 13/410,916 mailed Aug. 9, 2012, 9 pages.
Author Unknown, "MDS SDx Packaged Stations," Technical Manual, MDS 05-6312A01, Revision B, May 2011, GE MDS, LLC, Rochester, New York, 44 pages.
Author Unknown, "Quad Integrated IEEE 802.3at PSE Controller and Power Management System with up to 30W per Port Capabilities," Product Brief, BCM59103, Broadcom Corporation, Oct. 12, 2009, 2 pages.
Author Unknown, "Quad IEEE 802.3at Power Over Ethernet Controller," Product Brief, LTC4266, Linear Technology Corporation, 2009, 2 pages.
Author Unknown, "Single IEEE 802.3at Power Over Ethernet Controller," Product Brief, LTC4274, Linear Technology Corporation, 2009, 2 pages.
Author Unknown, "TPS23841: High-Power, Wide Voltage Range, Quad-Port Ethernet Power Sourcing Equipment Manager," Texas Instruments Incorporated, Nov. 2006, Revised May 2007, 48 pages.
International Search Report for PCT/US2010/034005 mailed Aug. 12, 2010, 4 pages.
International Preliminary Report on Patentability for PCT/US2010/034005 mailed Nov. 24, 2011, 7 pages.
International Search Report for PCT/US2011/055858 mailed Feb. 7, 2012, 4 pages.
International Preliminary Report on Patentability for PCT/US2011/055858 mailed Apr. 25, 2013, 8 pages.
International Search Report for PCT/US2011/055861 mailed Feb. 7, 2012, 4 pages.
International Preliminary Report on Patentability for PCT/US2011/055861 mailed Apr. 25, 2013, 9 pages.
International Search Report for PCT/US2011/061761 mailed Jan. 26, 2012, 3 pages.
International Preliminary Report on Patentability for PCT/US2011/061761 mailed Jun. 6, 2013, 9 pages.
Translation of the the First Office Action for Chinese Patent Application No. 201180059270.4 issued May 13, 2015, 19 pages.
International Search Report for PCT/US2013/058937 mailed Jan. 14, 2014, 4 pages.
International Preliminary Report on Patentability for PCT/US2013/058937 mailed Apr. 9, 2015, 7 pages.
Non-final Office Action for U.S. Appl. No. 13/626,371 mailed Dec. 13, 2013, 15 pages.
Non-final Office Action for U.S. Appl. No. 13/626,371 mailed Jun. 25, 2014, 16 pages.
Notice of Allowance for U.S. Appl. No. 13/626,371 mailed Nov. 25, 2014, 7 pages.
Notice of Allowance for U.S. Appl. No. 13/626,371 mailed Aug. 3, 2015, 7 pages.
Non-final Office Action for U.S. Appl. No. 13/859,985 mailed Feb. 27, 2015, 15 pages.
Final Office Action for U.S. Appl. No. 13/859,985 mailed Jul. 22, 2015, 8 pages.
Non-final Office Action for U.S. Appl. No. 13/860,017 mailed Feb. 27, 2015, 15 pages.
Final Office Action for U.S. Appl. No. 13/860,017 mailed Jul. 23, 2015, 8 pages.
Non-Final Office Action for U.S. Appl. No. 13/950,397, mailed Mar. 17, 2015, 6 pages.
Notice of Allowance for U.S. Appl. No. 13/950,397, mailed Jun. 10, 2015, 7 pages.
Non-Final Office Action for U.S. Appl. No. 13/771,756 mailed Sep. 10, 2014, 26 pages.
Final Office Action for U.S. Appl. No. 13/771,756 mailed Apr. 30, 2015, 38 pages.
International Search Report for PCT/IL013/050976, mailed Mar. 18, 2014, 3 pages.
Translation of the First Office Action for Chinese Patent Application No. 201180053270.3 issued May 26, 2015, 17 pages.
Translation of the First Office Action for Chinese Patent Application No. 201180052537.7 issued Jun. 25, 2015, 9 pages.
Non-final Office Action for U.S. Appl. No. 13/687,457 mailed Jul. 30, 2015, 12 pages.
Advisory Action for U.S. Appl. No. 13/771,756, mailed Aug. 21, 2015, 4 pages.
Non-final Office Action for U.S. Appl. No. 13/899,118, mailed Jan. 6, 2016, 10 pages.
Non-final Office Action for U.S. Appl. No. 14/845,768, mailed Nov. 19, 2015, 12 pages.
Non-final Office Action for U.S. Appl. No. 14/845,946, mailed Dec. 17, 2015, 11 pages.
International Search Report and Written Opinion for PCT/IL2015/050656, mailed Oct. 8, 2015, 9 pages.
The Second Office Action for Chinese Patent Application No. 201180059270.4, mailed Jan. 28, 2016, 42 pages.
Final Office Action for U.S. Appl. No. 13/687,457, mailed Feb. 12, 2016, 22 pages.
Notice of Allowance for U.S. Appl. No. 13/771,756, mailed Jan. 29, 2016, 14 pages.
Non-final Office Action for U.S. Appl. No. 14/317,475, mailed Feb. 3, 2016, 12 pages.

(56) References Cited

OTHER PUBLICATIONS

Arredondo, Albedo et al., "Techniques for Improving In-Building Radio Coverage Using Fiber-Fed Distributed Antenna Networks," IEEE 46th Vehicular Technology Conference, Atlanta, Georgia, Apr. 28-May 1, 1996, pp. 1540-1543, vol. 3.

Author Unknown, "INT6400/INT1400: HomePlug AV Chip Set," Product Brief, Atheros Powerline Technology, 27003885 Revision 2, Atheros Communications, Inc., 2009, 2 pages.

Author Unknown, "MegaPlug AV: 200 Mbps Ethernet Adapter," Product Specifications, Actiontec Electronics, Inc., 2010, 2 pages.

Cho, Bong Youl et al. "The Forward Link Performance of a PCS System with an AGC," 4th CDMA International conference and Exhibition, "The Realization of IMT-2000," 1999, 10 pages.

Chu, Ta-Shing et al. "Fiber optic microcellular radio", IEEE Transactions on Vehicular Technology, Aug. 1991, pp. 599-606, vol. 40, Issue 3.

Cutrer, David M. et al., "Dynamic Range Requirements for Optical Transmitters in Fiber-Fed Microcellular Networks," IEEE Photonics Technology Letters, May 1995, pp. 564-566, vol. 7, No. 5.

Dolmans, G. et al. "Performance study of an adaptive dual antenna handset for indoor communications", IEE Proceedings: Microwaves, Antennas and Propagation, Apr. 1999, pp. 138-144, vol. 146, Issue 2.

Ellinger, Frank et al., "A 5.2 GHz variable gain LNA MMIC for adaptive antenna combining", IEEE MTT-S International Microwave Symposium Digest, Anaheim, California, Jun. 13-19, 1999, pp. 501-504, vol. 2.

Fan, J.C. et al., "Dynamic range requirements for microcellular personal communication systems using analog fiber-optic links", IEEE Transactions on Microwave Theory and Techniques, Aug. 1997, pp. 1390-1397, vol. 45, Issue 8.

Schweber, Bill, "Maintaining cellular connectivity indoors demands sophisticated design," EDN Network, Dec. 21, 2000, 2 pages, http://www.edn.com/design/integrated-circuit-design/4362776/Maintaining-cellular-connectivity-indoors-demands-sophisticated-design.

Windyka, John et al., "System-Level Integrated Circuit (SLIC) Technology Development for Phased Array Antenna Applications," Contractor Report 204132, National Aeronautics and Space Administration, Jul. 1997, 94 pages.

International Preliminary Report on Patentability for PCT/US2011/061761 mailed May 28, 2013, 8 pages.

Author Unknown, "Equivalent Circuits—(Thevenin and Norton)," Bucknell Lecture Notes, Wayback Machine, Mar. 25, 2010, http://www.facstaff.bucknell.edu/mastascu/elessonsHTML/Source/Source2.html, 15 pages.

International Search Report and Written Opinion for PCT/IL2014/050766, mailed Nov. 11, 2014, 12 pages.

International Preliminary Report on Patentability for PCT/IL2014/050766, mailed Mar. 10, 2016, 9 pages.

Advisory Action and Applicant-Initiated Interview Summary for U.S. Appl. No. 13/687,457, mailed May 13, 2016, 5 pages.

Non-final Office Action for U.S. Appl. No. 13/687,457, mailed Jun. 27, 2016, 30 pages.

Non-final Office Action for U.S. Appl. No. 13/899,118, mailed Jun. 30, 2016, 11 pages.

Final Office Action for U.S. Appl. No. 14/317,475, mailed May 26, 2016, 12 pages.

Notice of Allowance for U.S. Appl. No. 14/317,475, mailed Aug. 5, 2016, 7 pages.

Notice of Allowance for U.S. Appl. No. 14/845,768, mailed Apr. 11, 2016, 8 pages.

Notice of Allowance for U.S. Appl. No. 14/845,946, mailed Jun. 8, 2016, 7 pages.

International Search Report and Written Opinion for PCT/IL2014/051012, mailed Mar. 5, 2015, 11 pages.

The Third Office Action for Chinese Patent Application No. 201180059270.4, issued Aug. 23, 2016, 6 pages.

Non-Final Office Action for U.S. Appl. No. 14/845,929, mailed Nov. 7, 2016, 5 pages.

Non-Final Office Action for U.S. Appl. No. 14/845,946, mailed Sep. 9, 2016, 10 pages.

Non-Final Office Action for U.S. Appl. No. 14/884,317, mailed Aug. 31, 2016, 16 pages.

Non-Final Office Action for U.S. Appl. No. 14/961,098, mailed Nov. 14, 2016, 10 pages.

* cited by examiner

INTERCONNECTION OF HARDWARE COMPONENTS

PRIORITY APPLICATION

This application claims the benefit of priority under 35 U.S.C. §119 of U.S. Provisional Application No. 62/051,510 filed on Sep. 17, 2014, the content of which is relied upon and incorporated herein by reference in its entirety.

BACKGROUND

The disclosure relates generally to providing connectivity between components.

Electronic systems can be assembled by connecting modules to other components. A backplane is one type of component that can be used to provide power, data, and other types of connectivity between other components. In some cases, multiple types of connectivity, such as power, data, radio frequency (RF), voice, etc., may be provided to a module via a backplane. Under certain circumstances, it may be desirable that when disconnecting a module from a backplane, that one type of connectivity be terminated before terminating other types of connectivity. Power is one type of connectivity that is often sought to be terminated before other types, typically to avoid damage to sensitive elements due to arcing, etc. A conventional approach is to open a power switch on a front panel of the module prior to disconnecting the module from the backplane. This approach, however, requires that the technician first be aware that the connectivity must be terminated prior to disengaging the component, and further does not account for the situation in which the technician knows to do so, but forgets to open the power switch. Another approach is to integrate an "OFF" switch into an ejection feature of a module. Conventional approaches, however, require a complex mechanical switch arrangement that adds cost to the system.

SUMMARY

According to a first embodiment, a hardware assembly comprises a module engaged with a backplane. The module comprises a module support, a first module connector supported on the module support and having at least one electrical conductor, and a second module connector supported on the module support. The backplane comprises a backplane support, a first backplane connector supported on the backplane support and connected to the first module connector, and a second backplane connector supported on the backplane support and connected to the second module connector. The second backplane can include at least one bias element and a translatable section that is configured to translate relative to the backplane support under a bias of the at least one bias element.

According to another embodiment, a method of disengaging a module from a backplane comprises providing a module comprising a module support, a first module connector supported on the module support and having at least one electrical conductor, and a second module connector supported on the module support. The method further comprises providing a backplane connected to the module and comprising a backplane support, a first backplane connector supported on the backplane support and connected to the first module connector, and a second backplane connector supported on the backplane support and connected to the second module connector. The method further comprises moving the module and backplane away from one another a first distance to cause the first module connector to disconnect from the first backplane connector, wherein the second module connector remains connected to the second backplane connector at the first distance, and further moving the module and backplane away from one another a second distance to cause the second module connector to disconnect from the second backplane connector.

According to one aspect, moving the module out of engagement with the backplane can allow the first module connector and first backplane connector to disconnect prior to disconnection of the second backplane connector from the second module connector. If the first module connector and first backplane connector provide, for example, power connectivity across the backplane and module, disconnection of the power connection can serve to protect components having connectivity across the second connectors.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

DETAILED DESCRIPTION

Figure 1:
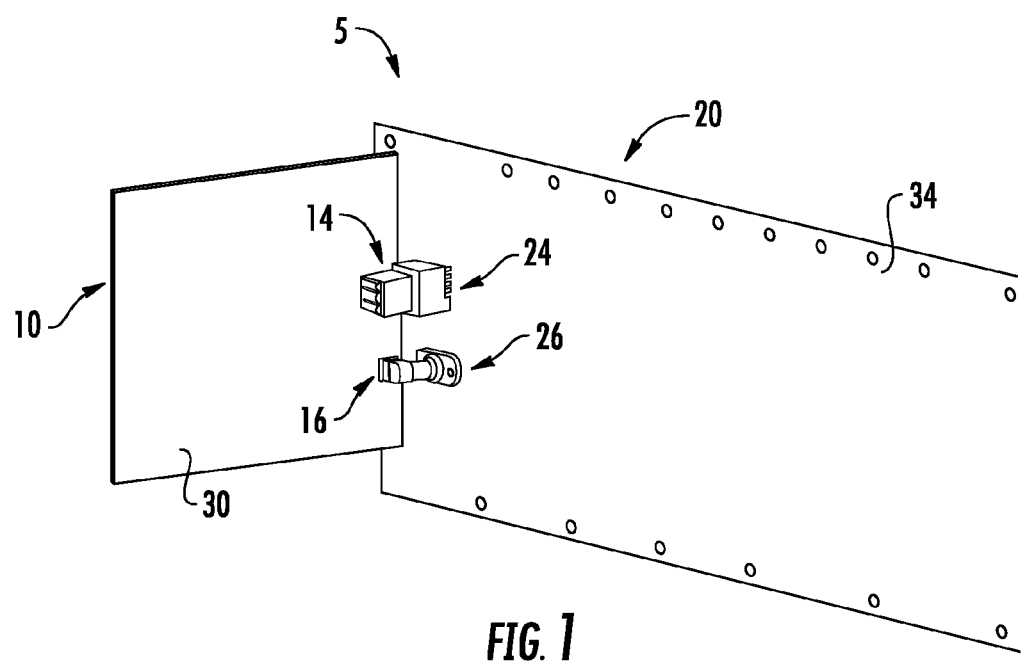
FIG. 1 illustrates a hardware assembly including a backplane component connected to a module component according to a first embodiment.

Reference will now be made in detail to the present preferred embodiment(s), examples of which are illustrated in the accompanying drawings. Whenever possible, the same reference numerals will be used throughout the drawings to refer to the same or like parts.

FIG. 1 illustrates a hardware assembly 5 including a first component 10 connected to a second component 20 according to a first embodiment. For illustrative purposes, the first component 10 is illustrated schematically as a module, such as a module for providing radio frequency (RF) services 10 via interconnection with the second component 20, which is illustrated as a backplane. The module 10 includes a first module connector 14 and a second module connector 16. The backplane 20 includes a first backplane connector 24 and a second backplane connector 26. The respective first connectors 14, 24, and the respective second connectors 16, 26 are configured to connect when the module 10 is engaged with the backplane 20.

The module 10 comprises a module support 30 that supports the connectors 14, 16, and the backplane 20 comprises a backplane support 34 that supports the connectors 24, 26. In the connected position shown in FIG. 1, the module support 30, which is a generally planar or plate-like or board-like piece, is generally perpendicular to a generally planar facing side of the backplane support 34. In FIG. 1, the backplane 20 is connected to a single example RF module 10 for clarity of illustration, but in practice several modules or other components of various types and configurations may be engaged with the backplane 20. A plurality of additional modules (not illustrated) can be engaged with the backplane 20, for example aligned parallel to the module 10 in side-by-side relationship.

The first module connector 14 and the first backplane connector 24 can be, for example, configured to connect to form one or more conductive paths that enable one or more of digital, voice, RF, data, and power connectivity. The second module connector 16 and the second backplane connector 26 can also be, for example, configured to enable one or more of digital, voice, RF, data, and power connectivity. In the illustrated exemplary embodiment, the first module connector 14 is a female digital and DC power connector, the first backplane connector 24 is a male digital and DC power connector, the second module connector 16 is a female backplane RF connector, and the second backplane connector 26 is a male RF backplane connector. The RF connectors 24, 16, are configured in a plug and jack configuration, and designed to provide connectivity in the RF range (e.g., exceeding 1 MHz).

According to one aspect, the first module connector 14 and first backplane connector 24 are configured to connect and to disconnect in response to the same relative motion between the module 10 and backplane 20 that causes the second module connector 16 to respectively connect and disconnect with the second backplane connector 26. According to one aspect, the respective connectors 14, 24, and 16, 26 may be configured so that, during disconnection, or disengagement, of the backplane 20 and the module 10, power connectivity between the connectors 14, 24 is disconnected before the RF connectivity between the connectors 16, 26 is disconnected.

Figures 2A, 2B:
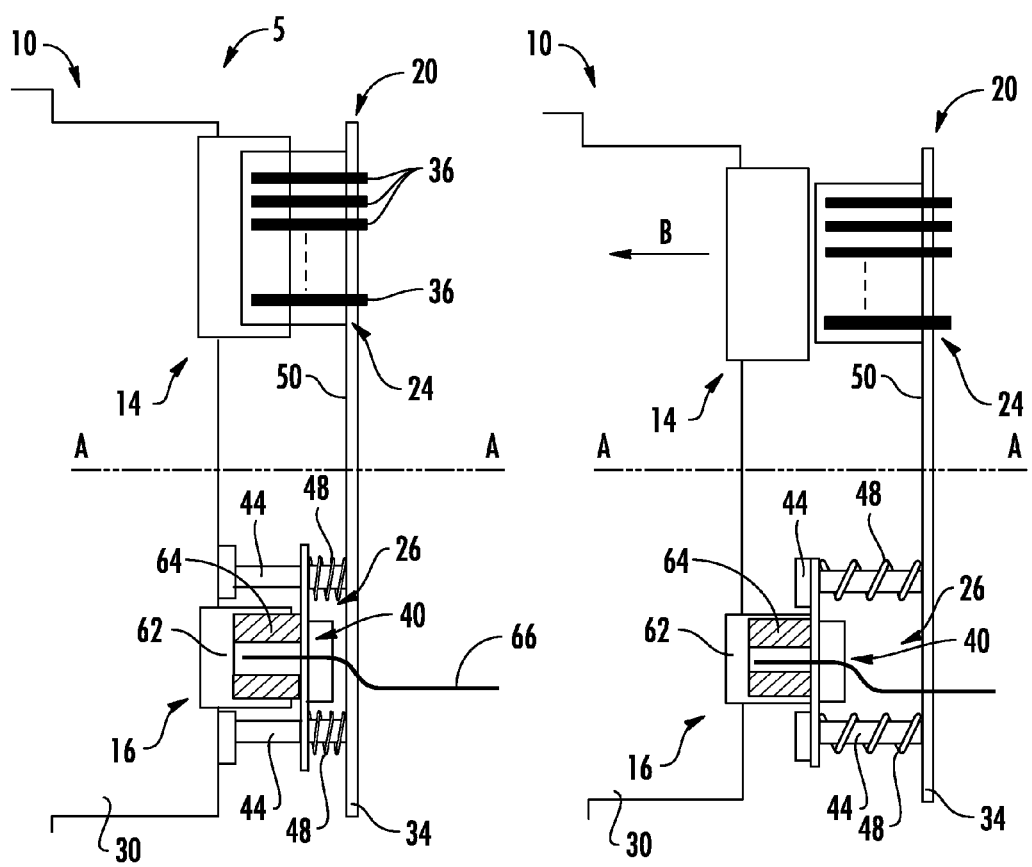
FIG. 2A illustrates the module component and backplane component in an engaged configuration.
FIG. 2B illustrates the module component and backplane component in a disengaged configuration.

FIGS. 2A and 2B are schematic, partial section views of the mechanism by which the module 10 and the backplane 20 disengage. In FIG. 2A, the module 10 is engaged with the backplane 20, with the first module connector 14 connected to the first backplane connector 24, and with the second module connector 16 connected to the second backplane connector 26. In this configuration, the first module connector 14 can engage a plurality of conductive elements 36 in the first backplane connector 24 in a conventional male/female interconnection, which brings the connectors 14, 24 into electrical connection over a plurality of conductive paths extending through the module 10 and the backplane 20. The conductive paths can convey, for example, data such as data in digital form, DC current, AC current, and other forms of electrical power and/or transmissions. The conductive paths may further extend from either the module 10 or from the backplane 20 to other components or cables (not illustrated), for example. The conductive paths can further connect to other conductors, conductive path, traces, and/or electronic components (not illustrated) of the module 10 and the backplane 20. The conductive elements 36 can be, for example, conductive metallic pins, wires, or other conductive structures. The first module connector 14 and the first backplane connector 24 can also or in addition to be optical in structure and operation, including, for example, one or more optical connections when engaged.

According to one aspect, the second module connector 16 and the second backplane connector 26 are configured to disconnect from the position shown in FIG. 2A at a time after the first connectors 14, 24 become disconnected. In an exemplary embodiment, disconnecting the first connectors 14, 24 ends power connectivity between the module 10 and backplane 20 across those connectors 14, 24. In order to effect the delay in disconnection, the second backplane connector 26 includes a translatable section 40 that is configured to translate relative to the backplane support 34 along pins 44, under the bias of one or more bias elements 48. The bias elements 48 can be, for example, springs. The translatable section 40 can be, for example, a generally planar piece, such as a plate, having a pair of apertures through which the pins 44 extend. The bias elements 48 can engage a surface 50 of the translatable section 40 and a surface of the backplane support 34 to bias the translatable section 40 away from the support 34 during disengagement of the module 10 and backplane 20. The direction of translation is along an axis A-A that can be, for example, generally perpendicular to the generally planar facing surface 50 of the backplane support 34. When the hardware assembly 5 is in the engaged or connected position of FIG. 2A, the bias elements 48 are fully compressed.

FIG. 2B illustrates disengagement of the module 10 and backplane 20. Referring to FIG. 2B, as the module 10 is moved away from the backplane 20, along the axis A-A and in the direction of arrow B, the first module connector 14 disengages from the first backplane connector 24, ending connectivity across the connectors 14, 24, and accordingly ending connectivity between the module 10 and the backplane 20 across connectors 14, 24. In one embodiment, the connection includes connectivity of at least one of DC power, AC power, and data. The second module connector 16 also disengages from the second backplane connector 26, but the disconnection is delayed as the bias elements 48 push the translatable section 40 away from the backplane support 34 and towards the module 10 so as to cause the connector 26 to remain connected to the second module connector 16. The exemplary second module connector 16 includes a female receptacle 62 that receives a conductive male projection 64 of the second backplane connector 26, such as in a coaxial RF connection. Further movement of the backplane 20 away from the module 10 causes the projection 64 to pull out of the female receptacle 62 to disconnect the second connectors 16, 26. The second backplane connector 26 also includes a conductor 66 that disconnects from electrical contact with the connector 16. In coaxial RF connectors, the conductor 66 is sometimes referred to as a "center conductor".

Figures 3A, 3B, 3C:
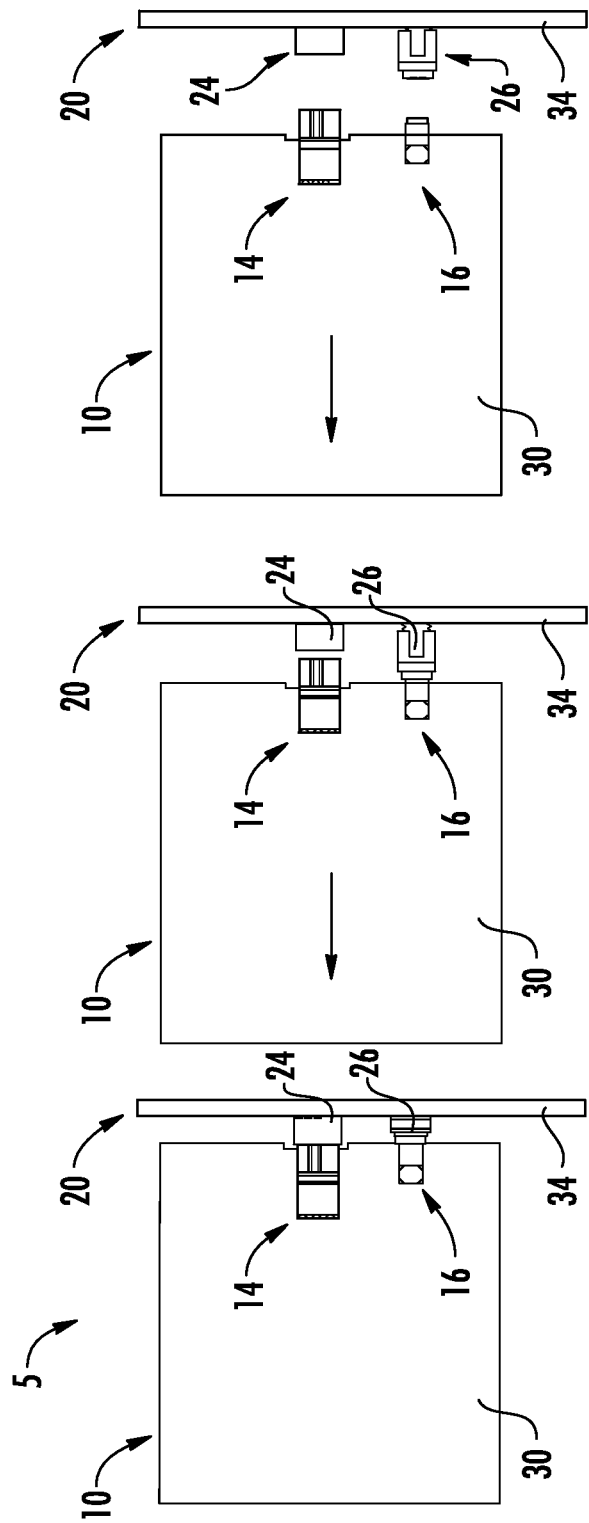
FIGS. 3A-3C illustrate the process of disengaging the module component from the backplane component.

FIGS. 3A-3C are side elevation views illustrating the disengagement process between the module 10 and the backplane 20. In FIG. 3A, the first module connector 14 is connected to the first backplane connector 24, and the second module connector 16 is connected to the second backplane connector 26. In FIG. 3B, the module 10 has been moved to the left in FIG. 3B a first distance that is sufficient to disconnect the first connectors 14, 24, but not a sufficient distance so that the translatable section 40 of the second backplane connector 26 allows the connector 26 to disconnect from the second module connector 16. If the first connectors 14, 24 provide power connectivity, power connectivity between the module 10 and backplane 20 is ended at this step. In FIG. 3C, the module 10 has been moved a second distance that is far enough so that the translatable section 40 reaches the extent of its motion away from the backplane support 34, and the second backplane connector 26 becomes disconnected from the second module connector 16. In this manner, any electrical connectivity across the connectors 14, 24, including any power connections, is ended before the connection between the connectors 16, 26.

The module 10 can be reengaged with the backplane 20 by aligning the connectors 14, 24, and the connectors 16, 26, and moving the module 10 and the backplane 20 towards each other. The second backplane connector 26 can be extended outwardly during reconnection to ensure it connects with the second module connector 16 before the connectors 14, 24 establish conductive connectivity.

In the illustrated embodiments, the module 10 and backplane 20 are shown as moved away from one another by pulling the module 10 away from the backplane 20, and moved toward one another by pushing the module 10 into connecting engagement with the backplane 20. The module 10 and backplane 20 can also be moved away from one another by movement of the backplane 20, and/or by moving both the module 10 and the backplane 20. In this specification, a statement that the module 10 and backplane 20 are moved away from one another, or moved toward each other, shall include relative motion caused either by motion of the module 10 or the backplane 20, or both.

According to the present embodiments, a "backplane" can be an arrangement of connectors arranged on a generally planar support. A backplane can be used as a backbone for connecting multiple circuit boards, for example. The backplane can include, for example, printed circuit board(s) for connectivity, and can be active or passive. A "backplane" may be an interconnect that provides connectivity to devices on both sides of the component, a configuration sometimes referred to as a "midplane", and further include components such as motherboards. The term "backplane" as used in this specification is intended to encompass all such applications.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

It will be apparent to those skilled in the art that various modifications and variations can be made without departing from the spirit or scope of the invention. Since modifications combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of disengaging a module from a backplane, comprising:

providing a module, comprising: a module support; a first module connector supported on the module support and comprising at least one electrical conductor; and a second module connector supported on the module support;

providing a backplane engaged with the module, comprising: a backplane support; a first backplane connector supported on the backplane support and connected to the first module connector; and a second backplane connector supported on the backplane support and connected to the second module connector;

moving the module and backplane away from one another a first distance to cause the first module connector to disconnect from the first backplane connector, wherein the second module connector remains connected to the second backplane connector at the first distance; and further moving the module and backplane away from one another a second distance to cause the second module connector to disconnect from the second backplane connector.

2. The method of claim 1, wherein the second backplane connector comprises at least one bias element and a translatable section, and wherein moving the module and backplane away from one another the first distance causes the translatable section to translate relative to the backplane support under a bias of the at least one bias element.

3. The method of claim 2, wherein:
the translatable section comprises a plate having at least one aperture, and
the at least one bias element comprises at least one pin extending through the at least one aperture, and at least one spring that engages the plate and that is arranged on the pin.

4. The method of claim 1, wherein the at least one electrical conductor of the first backplane connector comprises a plurality of electrical conductors, and wherein prior to disengagement of the module from the backplane, a plurality of conductive paths extend through the module and the backplane in part via the plurality of electrical conductors.

5. The method of claim 1, wherein when connected, the first module connector and the first backplane connector are configured establish at least one of a power and a data connection between the module and the backplane, and the second module connector and the second backplane connector are configured establish an RF connection between the module and the backplane.

6. The method of claim 1, wherein the module support includes a plate section and the backplane support has a generally planar facing surface, and wherein moving the module and backplane away from one another the first distance comprises moving the module along a direction generally parallel to the plate section of the module support.

* * * * *